United States Patent [19]

Shirae et al.

[11] Patent Number: 5,759,104
[45] Date of Patent: Jun. 2, 1998

[54] CONNECTOR AND ADAPTER UTILIZING CONNECTOR

[75] Inventors: Yutaka Shirae; Masayuki Yukawa; Masahiko Ota, all of Kyoto, Japan

[73] Assignee: Nintendo Co., Ltd., Kyoto, Japan

[21] Appl. No.: 377,587

[22] Filed: Jan. 24, 1995

[30] Foreign Application Priority Data

Jan. 25, 1994 [JP] Japan .................... 6-023669

[51] Int. Cl.⁶ ........................ H01R 13/648; A63F 9/24
[52] U.S. Cl. ............................... 463/45; 439/361
[58] Field of Search .................... 463/43, 44, 45, 463/46, 47; 361/731, 736, 741; 439/79, 569, 630, 361

[56] References Cited

U.S. PATENT DOCUMENTS

| | | | |
|---|---|---|---|
| 4,149,027 | 4/1979 | Asher et al. | 463/44 |
| 4,480,835 | 11/1984 | Williams | 273/148 B |
| 4,531,176 | 7/1985 | Beecher, II | 361/741 |
| 4,763,300 | 8/1988 | Yukawa | 463/44 |
| 4,844,465 | 7/1989 | Hibino et al. | 463/44 |
| 5,080,609 | 1/1992 | Fabian et al. | 439/569 |
| 5,104,326 | 4/1992 | Smith et al. | 439/95 |
| 5,169,345 | 12/1992 | Pernet | 439/630 |
| 5,192,082 | 3/1993 | Inoue et al. | 463/44 |
| 5,194,019 | 3/1993 | Rose | 439/569 |
| 5,256,085 | 10/1993 | Tan et al. | 439/607 |
| 5,282,621 | 2/1994 | Tseng | 463/45 |
| 5,362,068 | 11/1994 | Liu | 463/44 |
| 5,395,112 | 3/1995 | Darling | 463/45 |
| 5,400,222 | 3/1995 | Nelsen et al. | 361/736 |
| 5,468,154 | 11/1995 | Yip et al. | 439/79 |

FOREIGN PATENT DOCUMENTS

| | | |
|---|---|---|
| 0 266 855 | 3/1987 | European Pat. Off. . |
| 2 041 666 | 1/1980 | United Kingdom . |
| 2237154 | 4/1991 | United Kingdom ............ 439/630 |

*Primary Examiner*—Jessica Harrison
*Attorney, Agent, or Firm*—Nixon & Vanderhye P.C.

[57] ABSTRACT

A connector includes a housing, and a flange portion which is formed by extending one main surface of the housing in a direction that a first circuit board is inserted. An adapter includes a casing having an insertion port into which a cartridge for first game machine can be inserted, and having a shape capable of being inserted into an insertion port of a second game machine. An adapter circuit board is contained in the casing, and includes a data conversion circuit which converts first game machine data stored in the cartridge for first game machine into data capable of being utilized in the second game machine.

5 Claims, 5 Drawing Sheets

Fig. 6
FIG. 7
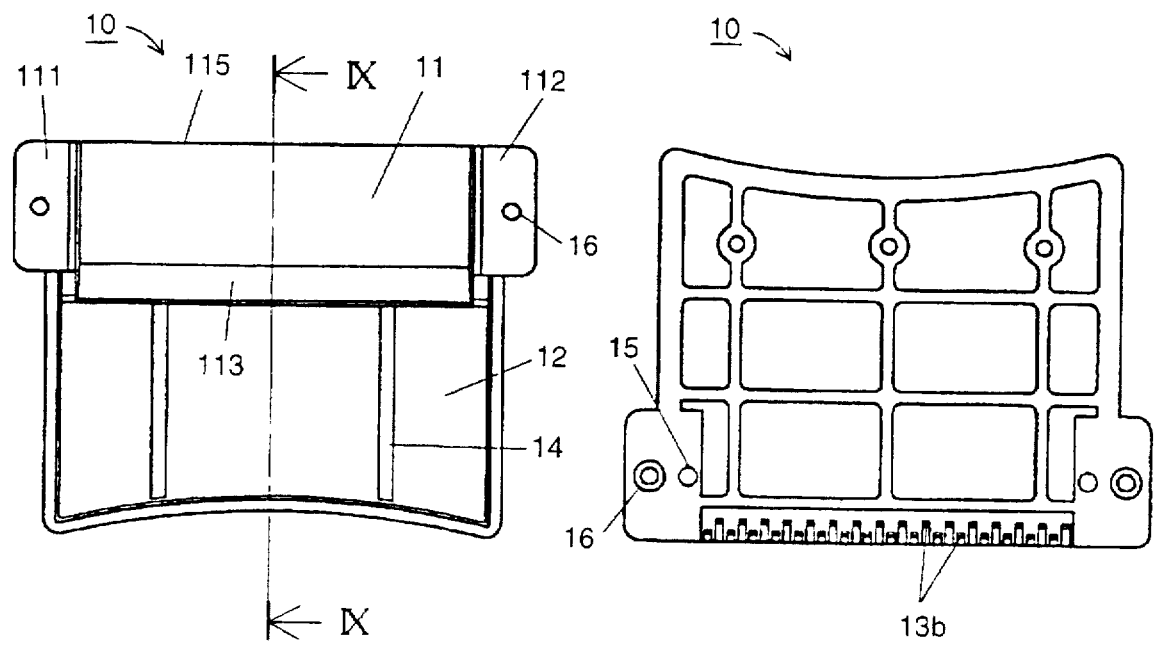
Fig. 8
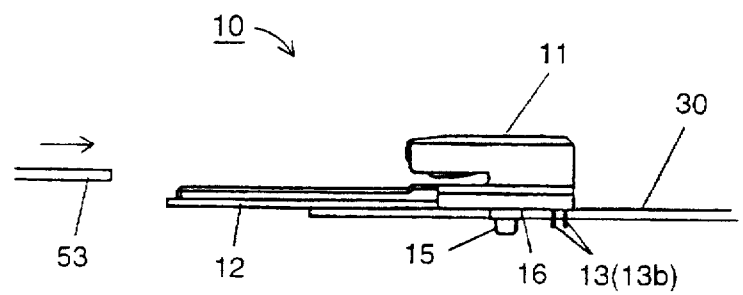
Fig. 9
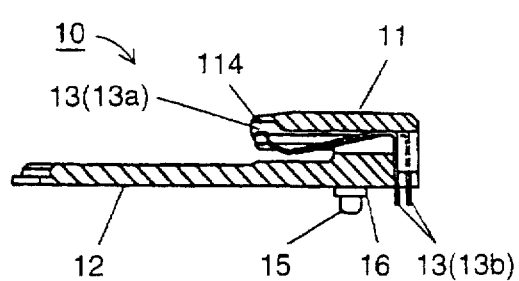

CONNECTOR AND ADAPTER UTILIZING CONNECTOR

BACKGROUND OF THE INVENTION

1. Field of the invention

The present invention generally relates to a connector and an adapter utilizing the same. More specifically, the present invention relates to a connector which stably connects a first circuit board and a second circuit board to each other, and an adapter which is utilized for connecting a cartridge for a first game machine to a second game machine so as to be used in the second game machine.

2. Description of the prior art

In the past, as such a kind of connector, a connector disclosed in Japanese Utility Model Application Laying-open No. 62-98183 (corresponding to U.S. patent Application No. 06/874,231) filed by the same assignee as that of the present invention is known, and as an adapter to which such a connector is applied, an adapter disclosed in Japanese Patent Application Laying-open No. 63-119789 (corresponding to U.S. Pat. No. 4,844,465) is known.

The conventional connector (Japanese Utility Model Application Laying-open No. 62-98183) has structure in which a circuit board is held by a pressure by which contact terminals (connection electrodes) is brought in elastically contact with the cartridge substrate, and a friction force between the contact terminals and the circuit board; however, since a contacting area of the connector and the circuit board is small in the above described holding method, in a case where the circuit board is pressed by an external force in a direction orthogonally intersecting to a main surface of the circuit board, there is a possibility that the circuit board is bent at a connection portion with the connector, and the circuit board is damaged.

In order to overcome such disadvantages of conventional connectors, the adapter disclosed in Japanese Patent Application Laying-open No. 63-119789 is provided with a guide supporting portion by which the circuit board is reinforced against to the external force of the direction orthogonally intersecting to the main surface of the circuit board (cartridge).

However, the above described adapter is inserted inside a game machine of a front loading system (second game machine), and therefore, it was impossible to make a thickness of the adapter larger than a thickness of a cartridge for second game machine which is originally used in the second game machine. Therefore, the guide supporting portion can not support the cartridge with a surface, and therefore, the guide supporting portion only supports left and right side surfaces of the circuit board. Therefore, if a large external force acts on the cartridge in the direction orthogonally intersecting to a main surface of the cartridge, there was a possibility that the circuit board is bent at a root of the guide supporting portion, and thus, damaged. Furthermore, in the field of a game equipment, because most of users are children, in many cases, the environment where the cartridge for game machine or the adapter for game machine is used is poor, and therefore, there are many cases where the cartridge or adapter is dropped or stomped.

Therefore, in the adapter disclosed in Japanese Patent Application Laying-open No. 63-119789, since the contacting area between the cartridge and the adapter is still small, and therefore, if the adapter is stamped, it was impossible to prevent the connector circuit board from being bent at a connection portion with the connector and thus destroyed.

Furthermore, in the conventional adapter for game machine is premised on an assumption that functions of the first game machine and the second game machine or processing abilities of CPUs contained in the first game machine and the second game machine are the same, and therefore, data formats of ROM cartridges used in the first game machine and the second game machine are the same. Accordingly, there was no adapter by which a cartridge can be commonly used in game machines having different functions or processing abilities. Therefore, if the user wants to play a game by a game software having a given data format, when a data format of the game software is not adapted to the game machine, the user must obtain a game machine to which such a data format is applicable. Since the game machine is not necessarily cheap, this becomes a large burden for the user.

SUMMARY OF THE INVENTION

Therefore, a principal object of the present invention is to provide a novel connector which connects two circuit boards to each other, and having a sufficient strength against to an external force in a direction orthogonally intersecting to a main surface of the circuit board, and capable of holding a cartridge stably, and capable of preventing the circuit board from being easily bent or damaged.

Another object of the present invention is to provide a novel adapter which connects a cartridge for first game machine to a second game machine in a sure and stable manner so as to be used in the second game machine, and even if functions or processing abilities of the first game machine and the second game machine are different from each other, it is possible to make the cartridge to be commonly used in the first game machine and the second game machine.

A connector according to the present invention is a connector for detachably connecting a first circuit board to a second circuit board, and comprises a plurality of connection electrodes, a housing, a flange portion, a guide projection, and an attaching portion. Each of the plurality of connection electrodes is formed by bending a belt-like electronic conductive metallic plate in an "L" shape in cross-section, and one end of the connection electrode is brought into elastic contact with the first circuit board, and other end of the connection electrode is electrically connected to the second circuit board. The housing is formed by an insulation material, and holds the plurality of connection electrodes along a first direction of the housing in a manner that the connection electrodes are not in contact and both ends of the connection electrodes are exposed. A flange portion is formed by extending one surface of the housing opposite to the second circuit board in a direction of the ends of the connection electrodes. The guide projection is formed on other surface of the flange portion by being extended along a direction that the first circuit board is attached. The attaching portion is formed on the one surface of the housing.

An adapter according to the present invention for making a cartridge for first game machine containing a memory be applicable to a second game machine comprises a casing, an adapter circuit board, and a connector. The casing includes a front casing and a rear casing, and has an insertion portion inserted to the second game machine, which is formed in a shape that the insertion portion can be adapted to the second game machine. An opening portion into which the cartridge for first game machine is inserted is formed on the front casing. The adapter circuit board is contained in the casing in a state where an end portion connected to the second game machine is exposed, and has one main surface on which electronic components or parts are mounted. The connector is attached to the other main surface of the adapter circuit board and can be detachably connected by the cartridge for first game machine, and comprises a plurality of connection electrodes, a housing, a flange portion, a guide projection, and an attaching portion. Each of the plurality of connection electrodes is formed by bending a belt-like electronic conductive metallic plate in "L" letter shape in cross-section, and one ends of the connection electrodes are brought into in elastically contact with the first circuit board, and other ends of the connection electrodes are electrically connected to the second circuit board. The housing is formed by an insulation material, and holds the plurality of connection electrodes along a first direction of the housing in a manner that the connection electrodes are not in contact with each other and both ends of the connection electrodes are exposed. The flange portion is formed by extending one surface of the housing opposite to the second circuit board in a direction of the one ends of the connection electrodes. The guide projection is formed on the other surface of the flange portion by being extended along a direction that the first circuit board is attached. The attaching portion is formed on the one surface of the housing.

The connector according to the first invention comprises the flange portion which is formed by extending one main surface of the housing. The flange portion holds the first circuit board (the cartridge for first game machine) with respect to the connector with a surface, and therefore, it is possible to secure a large contacting area between the connector and the cartridge.

Since the adapter according to the second invention is loaded with the above described connector, it is possible to secure a large contacting area with respect to the cartridge for first game machine. Furthermore, the adapter circuit board is provided with a data format conversion means which converts the format of data stored in the memory of the cartridge for first game machine into the format of data applicable to the second game machine, and therefore, it is possible to make a cartridge to be commonly used in game machines having different data formats.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a top plan view showing a connector in accordance with another embodiment of the present invention;

FIG. 7 is a bottom view of the connector in FIG. 6;

FIG. 8 is a right view showing the connector of FIG. 6;

FIG. 9 is a right cross-sectional view showing structure of the connector of FIG. 6.

DETAILED DESCRIPTION OF THE PREFERRED EMBODIMENTS

Figure 1:
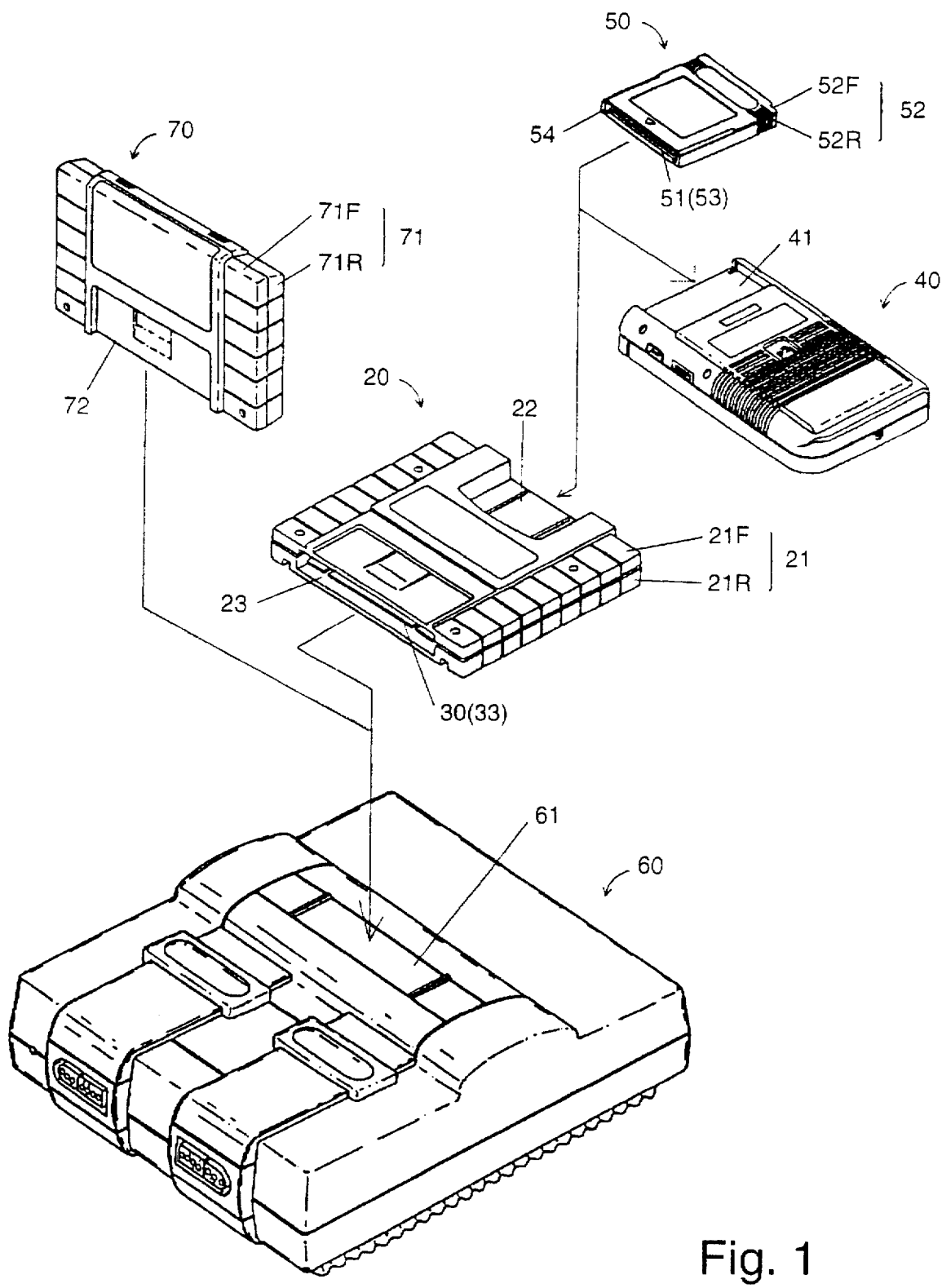
FIG. 1 is a perspective view showing an adapter in use in a game machine system, said adapter according to one embodiment of the present invention.
Figure 2:
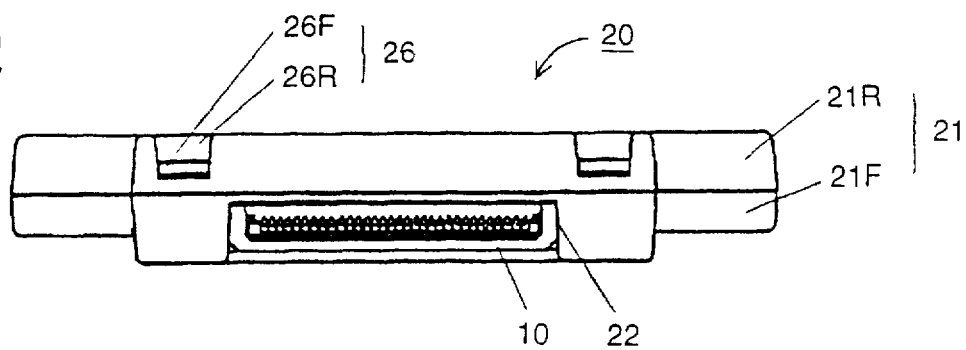
FIG. 2 is a top plan view showing the adapter of FIG. 1.

FIG. 6 is a top plan view showing one embodiment of a connector according to the present invention, and FIG. 7, FIG. 8 and FIG. 9 are bottom plan view, a right side view and a cross-sectional view at a line IX—IX of FIG. 6, respectively.

In the following, the connector will be described with referring FIG. 6 to FIG. 9. The connector 10 includes a housing 11 which is uniformly formed by an insulation material such as synthetic resin. The housing 11 includes a bottom portion of a long side ways rectangular parallelepiped having a thin thickness, and a portion of the bottom portion is extended below, and therefore, the housing is formed in a U-shape (or "コ" in Japanese Katakana letter) in cross-section in view of a side surface thereof, and attaching pieces 111 and 112 are formed at left and right side ends of the bottom portion. One side 113 in a longitudinal direction of the housing 11, is formed with holes (grooves) 114 for receiving connection electrodes 13 with constant intervals. On other side 115 in the longitudinal direction of the housing 11, at a lower portion, a plurality of opening portions 116 through which open ends of the connection electrodes 13 are exposed in a rear surface are formed along the longitudinal direction. A bottom surface of the housing 11 is extended toward the left in FIG. 8 so as to construct a flange portion 12.

Figure 4:
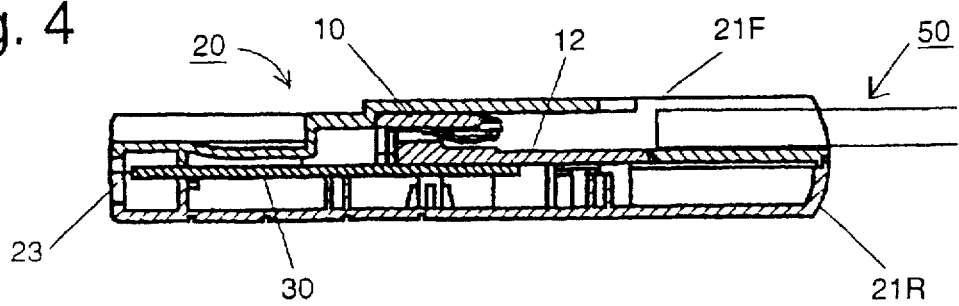
FIG. 4 is a cross-sectional view at a line IV—IV of the adapter of FIG. 1.
Figure 5:
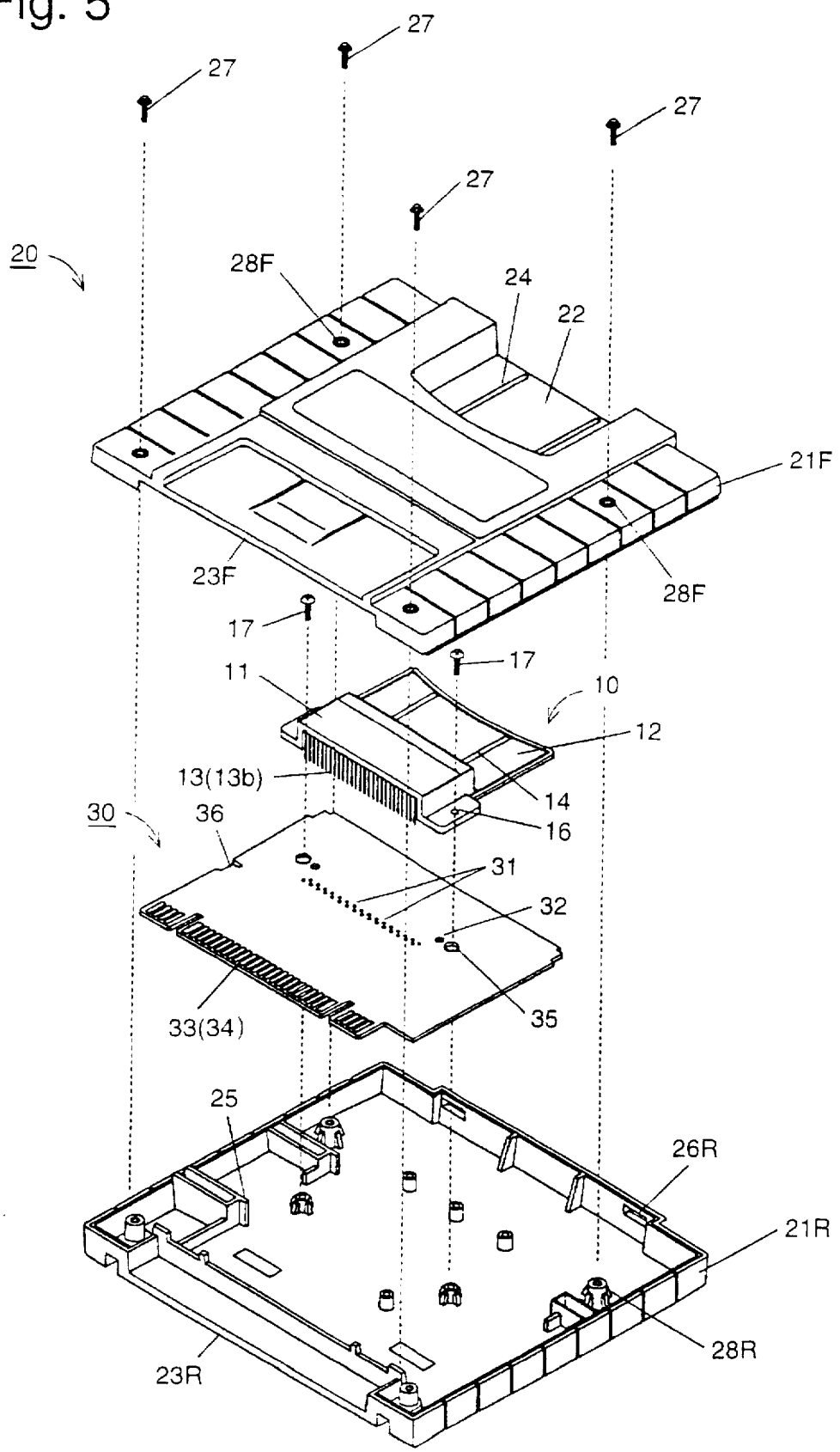
FIG. 5 is an exploded view showing the adapter.

Each of the connection electrodes 13 is formed by bending a bolt-like electric conductive metallic plate in an L-shape (shape in cross-section), and the connection electrodes 13 are held in a state where both ends of the connection electrodes 13 are exposed from the housing (see FIG. 9). The ends 13a of the connection electrodes 13 are positioned above the flange portion 12, and when a circuit board 51 of a cartridge for first game machine 50 (FIG. 4) is inserted, and the ends 13a are brought into elastic contact with the circuit board 51. The other ends 13b of the connection electrodes 13 are projected from the bottom surface of the housing 11, and connected to throughholes 31 formed on an adapter circuit board 30 (FIG. 5).

The flange portion 12 is formed by extending the bottom surface of the housing 11 with a thickness similar to a thickness of each of the attaching pieces 111 and 112 which are formed at the left and right side ends of the bottom surface or slightly thinner than the thickness of the attaching pieces 111 and 112. In order to reduce friction resistance according to an insertion of the cartridge for first game machine 50, guide projections 14 each having a little projected amount are formed on an upper surface of the flange portion 12. On the bottom surface of the housing 11, positioning projections 15 are formed with being projected toward the bottom surface. The positioning projections 15 make the adapter circuit board 30 to be positioned with easy in a cooperation with positioning holes 32 of the adapter circuit board 30.

FIG. 1 is a structural view showing a system in which an adapter of one embodiment according to the present invention is applicable. The connector 10 is contained in the adapter 20 (a game signal conversion apparatus) such that the cartridge for first game machine 50 (hereinafter simply called as "cartridge") used for a first game machine 40 (e.g. a game machine with a dot-matrix liquid crystal display, being manufactured and sold by the same assignee as that of the present invention, and a trademark of "GAME BOY") can be detachably connected to the adapter 20. The adapter 20 is attached to a second game machine 60 and used in a state where the cartridge 50 is attached to the adapter 20 instead of a cartridge 70 for the second game machine 60 (e.g. a 16-bit television game machine manufactured and sold by the same assignee as that of the present invention, a trademark of "SUPER FAMICOM" or "SUPER NES").

More specifically, an insertion port 41 having a rear surface to which the cartridge 50 is inserted is formed on the first game machine 40. The cartridge 50 includes a housing 52 composed of a front housing 52F and a rear housing 52R. The cartridge circuit board 51 is contained within the housing 52, and on the cartridge circuit board 51, a storage device (not shown) storing game data which is programmed on the basis of a data format for the first game machine 40. One end 53 of the cartridge circuit board 51 is held so as to be exposed from an opening 54 of the housing 52. An end portion of the housing 52 at a side of the opening 54 is formed with a shape insertable to the insertion port 41. The one end 53 of the cartridge circuit board 51 is connected to a connector (not shown) which is provided in the inner-most of the insertion port 41 in a direction that the cartridge is inserted, and the game data is read-out by a CPU (not shown) within the first game machine 40 to be used.

An insertion port 61 for inserting a cartridge for second game machine (hereinafter, simply called as "cartridge" 70 is formed on an upper surface of the second game machine 60. The cartridge 70 has a housing 71 composed of a front housing 71F and a rear housing 71R. A cartridge circuit board (not shown) is contained within the housing 71. A storage device (not shown) such as a ROM which stores data (game program) programmed for the second game machine 60 is mounted on the cartridge circuit board. One end of the cartridge circuit board is held in a manner that the same is exposed from an opening (not shown) which is formed on a bottom surface of the housing 71. An end portion 72 of the housing 71 at a side of the opening is formed with a shape insertable to the insertion port 61. The one end of the cartridge circuit board is connected to a connector (shown by a reference numeral 63 in FIG. 10) provided in the innermost of the insertion port 61 in a direction that the cartridge is inserted, and the game data can be read-out by a CPU (shown by a reference numeral 62 in FIG. 10) contained in the second game machine 60.

The adapter 20 includes a casing 21 composed of a front casing 21F and a rear casing 21R. An insertion port 22 to which the cartridge for first game machine 50 is insertable is formed on the front casing 21F with a shape similar to a shape of the insertion port 41. The adapter circuit board 30 is contained within the casing 21. External connection terminals 33 of the adapter circuit board 30 are exposed from an opening portion 23 formed on a bottom surface of the casing 21. One end of the housing 21 at a side of the opening portion 23 is formed with a shape similar to a shape of an end portion 72 of the cartridge 70, so that the casing can be inserted to the insertion port 61.

Figure 3:
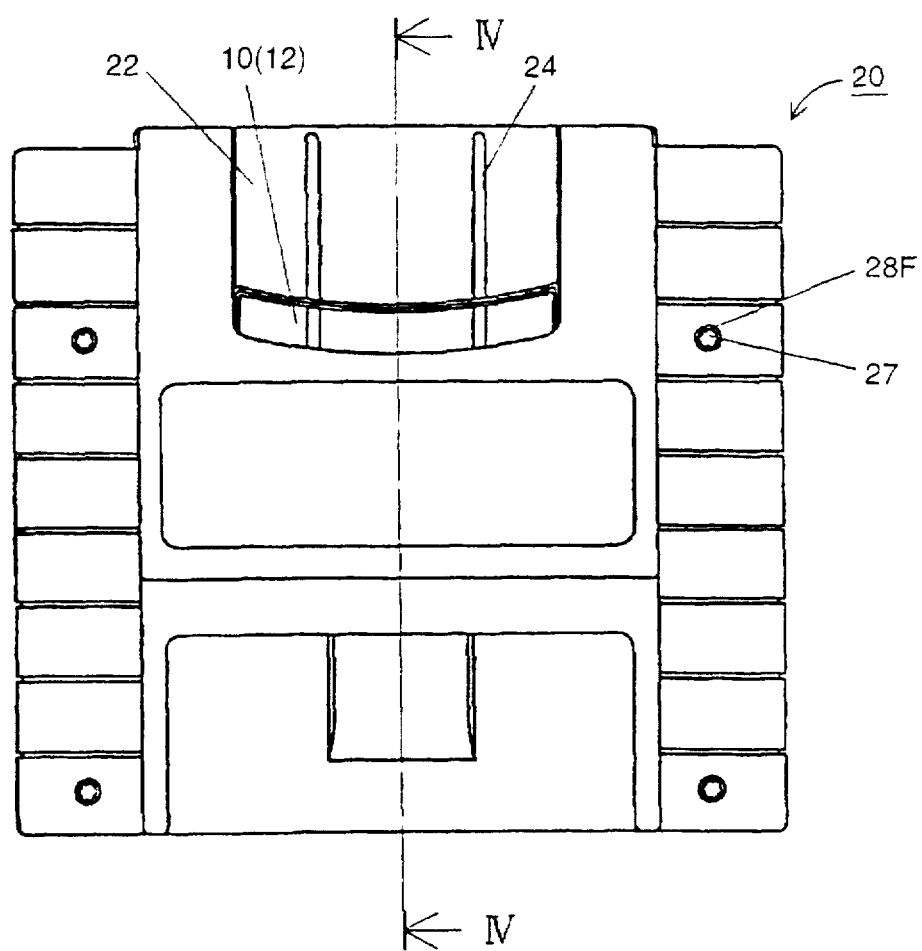
FIG. 3 is a front view showing the adapter of FIG. 1.

FIG. 2 to FIG. 5 show the adapter in detail, and especially, FIG. 2, FIG. 3, FIG. 4 and FIG. 5 are top plan view, a front view, a cross-sectional view at a line IV—IV in FIG. 3, and a disassembled perspective view, respectively. The connector 10 is mounted at the inner-most of the insertion port 22 in the direction that the cartridge is inserted, and a portion of the flange portion 12 is exposed from the insertion port 22. Within the insertion port 22, projections 24 similar to the guide projections 14 formed on the flange portion 12 are formed.

The adapter circuit board 30 (hereinafter, simply called as "circuit board") is formed with desired circuit patterns (not shown) with printed wirings, and a plurality of withdrawing electrodes 34 which are connected to the connector (63 in FIG. 10) of the second game machine 60 are formed on one end 33 of the circuit board 30. A plurality of electronic components or parts such as a CPU, RAM, ROM and etc. (components or parts within a portion surrounded by a frame indicated by a reference numeral 20 in FIG. 10) are mounted on the circuit board 30. In a state where the plurality of electronic components or parts are mounted on the circuit board 30, other ends 13b of the connection electrodes 13 are inserted into throughholes 31 formed on the circuit board 30, and the other ends 13b are soldered to predetermined patterns of the circuit board 30. The positioning of the connector 10 and the circuit board 30 is performed by the positioning projections 15 and the positioning holes 32. Furthermore, in cooperation of the connection electrodes 13 which are arranged in a zigzag fashion in two lines and the throughholes 31 which are formed in a zigzag fashion in two lines in corresponding to the connection electrodes, the connector 10 is prevented from being erroneously attached to the circuit board 30.

After all the electronic components or parts and the connector 10 are mounted on the circuit board 30, the circuit board 30 is attached to the rear casing 21R. Holes 35 each having a diameter larger than a diameter of each of bosses 16 of the connector 10 are formed on the circuit board 30. The bosses 16 penetrate the holes 35 in a state where the connector 10 is solded onto the circuit board 30. Then, the connector 10 and the rear casing 21R are coupled to each other by screws 17, and the circuit board 30 is sandwiched by the connector 10 and the rear casing 21R. By holding the circuit board 30 in the above described manner, cracks which may easily occur at screwed portions in the circuit board can be prevented. Furthermore, notches 36 are formed on the circuit board 30, and in cooperation with ribs 25 on the rear casing 21R, the circuit board 30 is prevented from being attached to the rear casing 21R in a reversed direction.

An engage portion 26 is formed on the casing 21. The engage portion 26 is composed of engaging claws 26F (FIG. 5) formed on the front casing 21F and engaging holes 26R formed on the rear casing 21R. Then, after making the engage portion 26, by fastening screws 27 to bosses 28R through holes 28F such that the front casing 21F and the rear casing 21R are coupled to each other with screw, whereby the housing 21 can be uniformly constructed. When the housing is uniformly constituted, the opening portion 23 is formed at a side of the bottom surface by a bottom portion notch 23F of the front casing 21F and a bottom portion notch 23R of the rear casing 21R. The one end 33 of the circuit board 30 is exposed from the opening portion 23, and the withdrawing electrodes 34 are connected to the connector (63 in FIG. 10) of the second game machine 60.

If the processing abilities or functions (and therefore, data formats and etc.) of the first game machine 40 and the second game machine 60 are the same, the adapter 20 applies the data from the cartridge 50 to the second game machine 60 with no change, and therefore, the adapter 20 may be used as an adapter for making a shape of the cartridge 50 be applicable only.

However, if the data formats of the first game machine 40 and the second game machine 60 are different from each other, the game data read-out from the cartridge 50 must be converted into the data format applicable to the second game machine 60. Therefore, on the circuit board 30 contained in the adapter 20, electronic circuits or semiconductor integrated circuits surrounded by a dotted line indicated by a reference numeral 20 shown in FIG. 10 are mounted.

Figure 10:
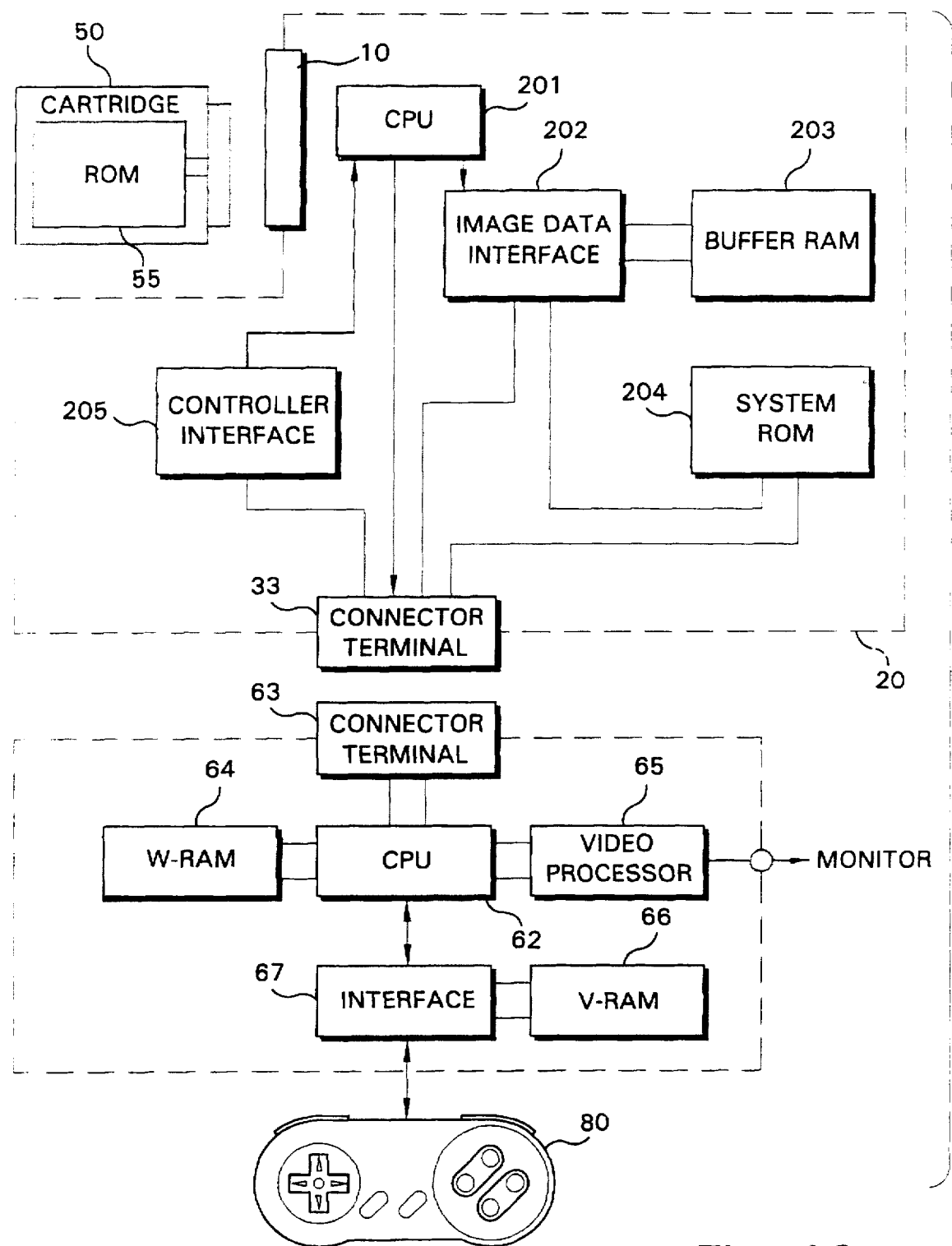
FIG. 10 is a block diagram showing a whole game machine system in which the adapter according to the second invention is applied.

FIG. 10 is a block diagram showing a whole game machine system to which the adapter 20 according to the present invention is applied. In the game system, in order to use the cartridge 50 for the first game machine 40 as the cartridge 70 for the second game machine 60, the adapter 20 is used to attach or detach the cartridge 50 to or from the second game machine 60.

The adapter 10 contains therein a CPU 201 having the same ability or performance as that of an 8-bit CPU (not shown) used in the first game machine 40 to which the cartridge 50 was originally designed; and a meaning of the CPU includes not only a central processing unit called in general as a CPU but also an IC or unit dedicated by image processing or video signal processing. If the first game machine 40 is a game machine with a monochrome liquid crystal display, the CPU 201 generates a graded image data (hereinafter, called as "gradation data"), and if the first game machine is an 8-bit television game machine, the CPU 201 generates a color-toned image data. The CPU 201 is connected to the connector 10 via a data bus and an address bus. To the CPU 201, an image data interface 202 is connected. To the image data interface 202, a buffer memory (hereinafter, called as "buffer RAM") 203 is connected, and further, a system ROM 204 and the connector connection terminals 33 are connected via the data bus and the address bus.

The cartridge 50 attached to the adapter 20 contains therein a non-volatile memory (e.g. a read-only-memory, hereinafter, called as "ROM") 55. The ROM 55 includes a plurality of storage areas.

A given storage area includes register file by which the cartridge 50 can be applied to the adapter 20, for example, ID data which is used for determining an authenticity of the cartridge 50 in starting an operation (in turning-on a power source), a code of a manufacturer of the cartridge 50, and a color palette setting identifying code, respectively.

Another storage area is a storage area for storing image display data for a monochrome display, and store at least character data of a plurality of characters for game and program data for controlling display of the plurality of characters. More specifically, each of the characters is constituted by 8×8 dots, and therefore, the character storage area stores the character data of a single character by gradation data representative of four kinds of gradations by 2 (two) bits for each dot. For example, black, dark gray, light gray and white are represented by the gradation data of "11", "10", "01" and "00", respectively. Therefore, the character storage area of the ROM 55 has a storage capacity of 16 times the number of characters capable of being displayed at maximum because an area of twice 8 bits×8 byte (16 byte) is required for the single character.

Then, the CPU 201 generates gradation data composed of a plurality of gradations for each character on the basis of the image display data stored in the ROM 55 contained in the cartridge 50, and outputs the gradation data to the image data interface 202 in synchronous with timings for displaying the character on the dot-matrix liquid crystal display.

A buffer RAM 203 for temporarily storing image data processed for the first game machine by the CPU 201, for example, the gradation data for each dot is connected to the image data interface 202. The buffer RAM 203 is used for synchronization adjustment between a timing that the CPU 201 generates the gradation data for the first game machine 40 and a timing that the character is displayed in the second game machine 60. On the assumption that a storage capacity capable of storing the gradation data for 20 (twenty) characters, for example, is 1 (one) block, the buffer RAM 203 has a storage capacity of 4 (four) blocks. Furthermore, the CPU 201 outputs a sound signal on the basis of sound source data stored in the ROM 55, and applies the same to a sound signal output terminal of the connector terminals 33. For generating or producing the image data by the CPU 201, techniques discloses in Japanese Patent Laying-open No. 2-210562 (corresponding to U.S. Pat. No. 5,134,391).

The image data interface 202 makes the gradation data to be stored in the buffer RAM 203 temporarily, and controls read-out of the gradation data of one block for each interrupt signal from a CPU 62, whereby the gradation data generated in synchronization with a display timing of the liquid crystal display can be transferred to a W-RAM 64 from the buffer RAM 203 via a data bus, an address bus, the connector terminals 33, the CPU 62 and the connector 63, and therefore, the gradation data can be outputted from the second game machine 60 in synchronization with raster scanning of the monitor.

Furthermore, a system ROM 204 is further connected to the data bus and the address bus. The system ROM 204 stores a program which is executed by the CPU 62 included in the second game machine 60 and for converting the gradation data for the first game machine 40 into image display data capable of being applied to the second game machine 60, and other programs.

Furthermore, to the data bus, a controller interface 205 is connected, and an output of the controller interface 205 is applied to the CPU 201. The controller interface 205 transfers, when the data indicating an operation status of an operation device or controller 80 in the game mode is supplied, the data to the CPU 201. Furthermore, the controller (operation device) 80 is connected to the CPU 62 via an interface 67, and the data indicative of operated status of the controller 80 is read in the CPU 62 with constant time intervals, and the data is used as a command signal for controlling or changing a displayed state of the character.

In addition, in order to exclude a false game cartridge which is unfairly copied or modified, a program for determining an authenticity of the cartridge may be stored in the adapter such that when the false cartridge is attached, execution of the game may be made impossible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A connector for detachably connecting a first circuit board having a plurality of edge electrodes to a second circuit board, said connector comprising:
   a plurality of connection electrodes, each of which has an L-shape in cross-section and includes one bent end and an other end, said bent end and said other end electrically connected together;
   a housing comprised of an insulation material and including a first plate and a second plate, said plates each having two ends, said plates spaced apart from one another, said plates connected to each other at one end by a connection portion, said first plate having an inner surface with a plurality of receiving portions, each receiving portion adapted to receive a respective one of said plurality of connection electrodes where the connection electrodes are not in contact with each other, said bent end of each connection electrode extends from said first plate inner surface and said other end of each connection electrode projects from a bottom surface of said second plate;

a flange portion comprising an other end of said second plate of said housing said second plate other end extending in a first direction over said first plate other end; and a guide projection on an inner surface of said flange portion and extending in said first direction.

wherein said first circuit board is inserted into a space between said first plate and said second plate while said first circuit board is guided by said guide projection, each of said edge electrodes of said first circuit board being elastically in contact with said bent end of said connection electrode, said first circuit board being supported by elastic forces of said bent end of said connection electrodes against said flange portion and said second circuit board is electrically connected to said other ends of said connection electrodes.

2. A connector according to claim 1, wherein said other ends of said plurality of connection electrodes are arranged in a zigzag fashion in two lines.

3. An adapter for making a cartridge for a first game machine containing a memory mounted on a circuit board to be applied to a second game machine, said adapter comprising:

a casing which includes a front casing and a rear casing, and has an insertion portion having a shape such that an insertion portion can be inserted into said second game machine;

an opening portion formed on said front casing and having a shape adapted to receive said cartridge for first game machine;

an adapter circuit board which is contained in said casing in a state where an end portion connected to said second game machine is exposed, and has one main surface on which electronic components are mounted;

a connector which is attached to an other main surface of said adapter circuit board having a plurality of edge electrodes, and being detachably connected by said cartridge for first game machine, wherein said connector includes:

a plurality of connection electrodes, each of which has an L-shape in cross-section and includes one bent end and an other end;

a housing comprised of an insulation material and including a first plate and a second plate, said plates each having two ends, said plates spaced apart from one another, said plates connected to each other at one end by a connection portion, said first plate having an inner surface with a plurality of receiving portions, each receiving portion adapted to receive a respective one of said plurality of connection electrodes where the connection electrodes are not in contact with each other, said bent end of each connection electrode extends from said first plate inner surface and said other end of each connection electrode projects from a bottom surface of said second plate;

a flange portion comprising an other end of said second plate of said housing said second plate other end extending in a first direction over said first plate other end; and a guide projection on an inner surface of said flange portion and extending in said first direction, wherein said first circuit board is inserted into a space between said first plate and said second plate while said first circuit board is guided by said guide projection, each of said edge electrodes of said first circuit board being elastically in contact with said bent end of said connection electrode, said first circuit board being supported by elastic forces of said bent end of said connection electrodes against said flange portion and said second circuit board is electrically connected to said other ends of said connection electrodes.

4. An adapter according to claim 3, wherein said other ends of said plurality of connection electrodes are arranged in a zigzag fashion in two lines, and said adapter circuit board is formed with throughholes arranged in a zigzag fashion in two lines in corresponding to said other ends of said plurality of connection electrodes, and in asymmetry shape of a plane figure.

5. An adapter according to claim 3, wherein said adapter circuit board includes a data transfer means which converts game control data stored in said memory of said cartridge for first game machine into data applicable to display control in said second game machine, and transfers the data to said second game machine.

* * * * *